United States Patent [19]

Turner et al.

[11] Patent Number: 4,988,159

[45] Date of Patent: Jan. 29, 1991

[54] FIBER TAILED OPTOELECTRONIC TRANSDUCER

[75] Inventors: Andrew S. Turner, Paignton; Trevor E. J. Hext, Newton Abbot; Adrian P. Janssen, Exeter, all of Great Britain

[73] Assignee: STC PlC, London, England

[21] Appl. No.: 230,057

[22] Filed: Aug. 9, 1988

[30] Foreign Application Priority Data

Aug. 19, 1987 [GB] United Kingdom ............... 8719590

[51] Int. Cl.⁵ .......................... G02B 6/36; G02B 7/26
[52] U.S. Cl. ................................ 350/96.20; 350/96.17
[58] Field of Search ............... 350/96.17, 96.20, 96.21

[56] References Cited

U.S. PATENT DOCUMENTS

| | | | |
|---|---|---|---|
| 4,168,883 | 9/1979 | MacLeod | 350/96.20 |
| 4,296,998 | 10/1981 | Dufft | 350/96.17 |
| 4,767,178 | 8/1988 | Sasaki et al. | 350/96.21 |

FOREIGN PATENT DOCUMENTS

| | | |
|---|---|---|
| 0183302 | 6/1986 | European Pat. Off. . |
| 0183857 | 6/1986 | European Pat. Off. . |
| 2026226 | 12/1986 | European Pat. Off. . |
| 3413748 | 10/1985 | Fed. Rep. of Germany . |
| 58-205119 | 3/1984 | Japan . |
| 2022280 | 12/1979 | United Kingdom . |
| 2131971 | 6/1984 | United Kingdom . |
| 2184289 | 6/1987 | United Kingdom . |
| 8606472 | 11/1986 | World Int. Prop. O. . |

OTHER PUBLICATIONS

Kawano, "Laser Diode Module for Single-Mode Fiber Based on New Confocal Combination Lens Method", Journal of Lightwave Technology, vol. LT-4, No. 9, Sep. 1986.

Primary Examiner—William L. Sikes
Assistant Examiner—Robert E. Wise
Attorney, Agent, or Firm—Lee, Mann, Smith, McWilliams & Sweeney

[57] ABSTRACT

An optoelectronic transducer (1) is connected with a fiber optic tail (22) by providing a casing (3) around the transducer having a flat wall (9) and by providing a termination body (20) on the fiber (22) with a thin wall flange (20A), aligning the optical axes (11, 29) and laser welding the flange to the casing.

16 Claims, 4 Drawing Sheets

FIBER TAILED OPTOELECTRONIC TRANSDUCER

This invention relates to fibre tailed semiconductor optical emitters and receiver devices, hereinafter sometimes referred to as optoelectronic transducers.

Semiconductor lasers and photodetectors are normally provided with fibre tails to enable connection into optical transmission systems. An example is disclosed in our published British patent application 2124402B.

This patent describes a relatively complex structure.

European Patent Application 0181532 discloses a fibre-to-fibre connection in which the welding is effected within a circle around the coupling surfaces to minimise distortion. As exemplified in FIGS. 19 and 20 a submount for the laser and fibre is split in two halves and welded at the edges at the point Sp.

The main disadvantage of this arrangement is the split submount which is not hermetically sealed, so the final assembly needs to be built into a DIL package, or similar to that shown in our earlier patent 2124402B mentioned earlier, in order to obtain an hermetically sealed arrangement.

Secondly, the solution to the welding problem encountered is not necessarily satisfactory because welding points still occur at places where stress due to welding will cause distortion. This is particularly so at the upper welding point in FIG. 20 where shrinkage upon cooling will tend to open up the gap K to 16 until the lower welding point has been completed.

It is an object of the invention to provide a technique for providing an hermetically-sealed optoelectronic transducer with a fibre tail in a simple, reliable and cost effective way.

According to the present invention there is provided an optical electronic package comprising an optical photodetector, receiver or emitter device having an optical fibre tail optically coupled thereto via an optical window, the package comprising an hermetic container encasing the device and having said optical window therein, a fibre termination body secured to the fibre tail, said container and said body each having a wall transverse to the optical axis of the device and which each abut one another, one of said walls being formed by a flange extending radially from the optical axis, said container and said body being permanently held together by a plurality of welds between said walls.

According to another aspect of the present invention there is provided a method of optically coupling an optical semiconductor, photodetector, receiver or emitter device with an optical fibre tail via an optical window to provide an optical electronic package, comprising providing said device in an hermetic container having said window and a wall around the optical axis of the window, providing a fibre tail with a termination body secured thereto, said body having a wall around the optical axis of the fibre tail, one of said walls being a flange wall, abutting the walls together while monitoring the optical energy transferred between the fibre and the device, and welding the flange wall to the other wall at a plurality of spaced apart locations.

According to a further aspect of the present invention there is provided an optical electronics package comprising an optical transmitter having an optical fibre tail optically coupled thereto, said package comprising an hermetic structure encasing the transmitter and having a window sealed in the structure so that optical energy from the transmitter exits via said window, said fibre having a termination with a wall extending radially of the fibre axis, said wall being secured to said structure with a plurality of welds.

According to yet another aspect of the present invention there is provided a method of making an optical transmitter package comprising providing a mounting body having a fixed lens seat and a pedestal for a transmitter device, securing a spherical lens in the seat, and securing the transmitter device to the pedestal in such a position that optical energy from the device will emerge from the package at a small angle to the normal through a plane containing a securing surface, said package being hermetically sealed and securable to an optical fibre termination by said surface, said optical fibre having an inclined face to receive said optical energy.

In order that the invention can be clearly understood, reference will now be made to the accompanying drawings, in which:

FIG. 3 shows the two coupling parts of FIGS. 1 and 2 joined together and FIG. 3A shows an end view of FIG. 3;

FIG. 6 shows schematically apparatus for assembling the embodiments of the invention;

Figure 1:
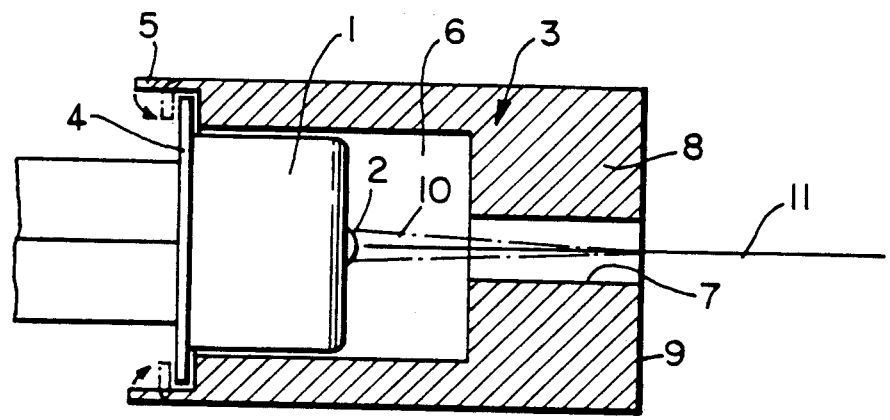
FIG. 1 shows a light emitting diode encapsulated in a TO18 can and fitted into a first part of the fibre coupling according to an embodiment of the invention.

Referring to FIG. 1 a light emitting diode hermetically sealed in a TO18 type can 1 is shown, with a window formed by a focussing lens 2 sealed in the can. The can 1 is fitted into a stainless steel termination 3 which is configured to fit the can 1. The can 1 has a peripheral base region 4 which is held by turning over a rim portion 5 of the termination, as indicated by the arrows and the broken lines show the position of the rim 5 after it has been turned over. The specific can used is a type T018 which is well known in the art, but other TO types may also be suitable and indeed yet others are usable provided they have an end face 9 normal to the focal axis as discussed later.

The termination 3 has a hollow interior 6 to accommodate the body of the can 1 and a narrow bore 7 through which the light beam 10 from the lens 2 will travel. The base 7 extends through a thick flange 8 and the end-face 9 is exactly normal to the optical axis 11 of the device. The flange 8 can vary in thickness dependent upon the focal length.

Instead of an emitter the TO18 can could instead house a photodetector or a receiver.

As mentioned the TO18 can is only one example of a hermetic sealing container. Other hermetic sealing containers could be used, in which case the precise configuration of the left hand portion of the termination 3 would be modified accordingly to fit such containers and be secured thereto in similar fashion.

Figure 2:
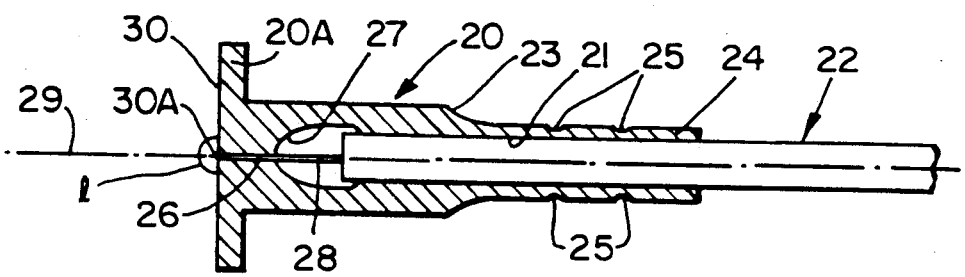
FIG. 2 shows a fibre tail terminated in the second part of the fibre coupling of FIG. 1 according to the embodiment of the invention.

Referring now to FIG. 2, the fibre termination comprises a stainless steel tube 20 having a bore 21 which fits the coated optical fibre 22, which in this embodiment is a multimode fibre with a coated outside diameter of about 1mm. The invention is also usable with monomode fibres.

The tute is stepped at 23 so that the right hand end portion 24 has a wall thickness small enough to enable the portion 24 to be lightly crimped onto the fibre 22 and this is indicated at 25.

The tube 20 is stepped internally at 27 towards the left hand and to provide a tiny bore 26 of about 0.15 mm diameter to accommodate the optical fibre end 28 from which the Plastics coating has been removed. The fibre 22 is also set in resin to lock the fibre end in the bore 26. The termination has an end flange 20A at the left hand and which is normal to the optical axis 29 of the fibre and the face 30 of the end flange 20A is lapped and polished so that both the fibre end face 30A and the face 30 of the flange 20A are co-planar and normal to the axis 29.

In some circumstances the fibre end may be provided with a lens 1 in order to control the optical beam emerging from the fibre in the case of use of this invention for an optical receiver device.

Figure 3:
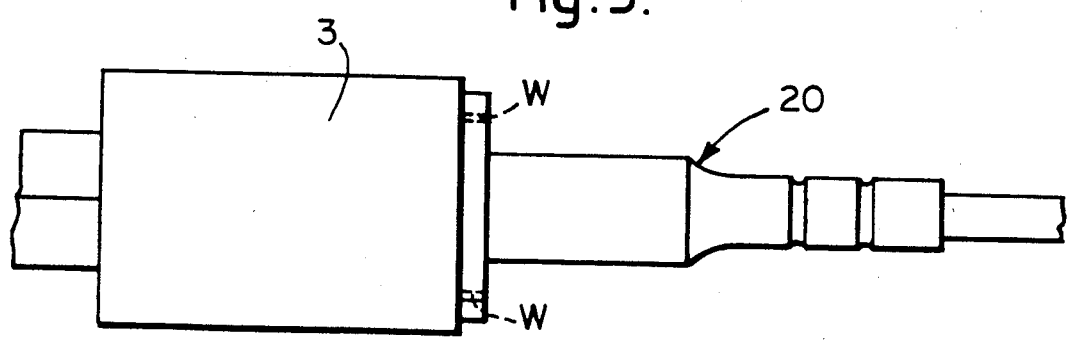

FIG. 3 shows the device termination and the fibre termination joined together with the end faces 9 and 30 butted together and the thin flange 20A welded at several spaced apart locations W around the flange to the face 9 of the termination 3, using a laser welder (see FIG. 3A).

Figure 4:
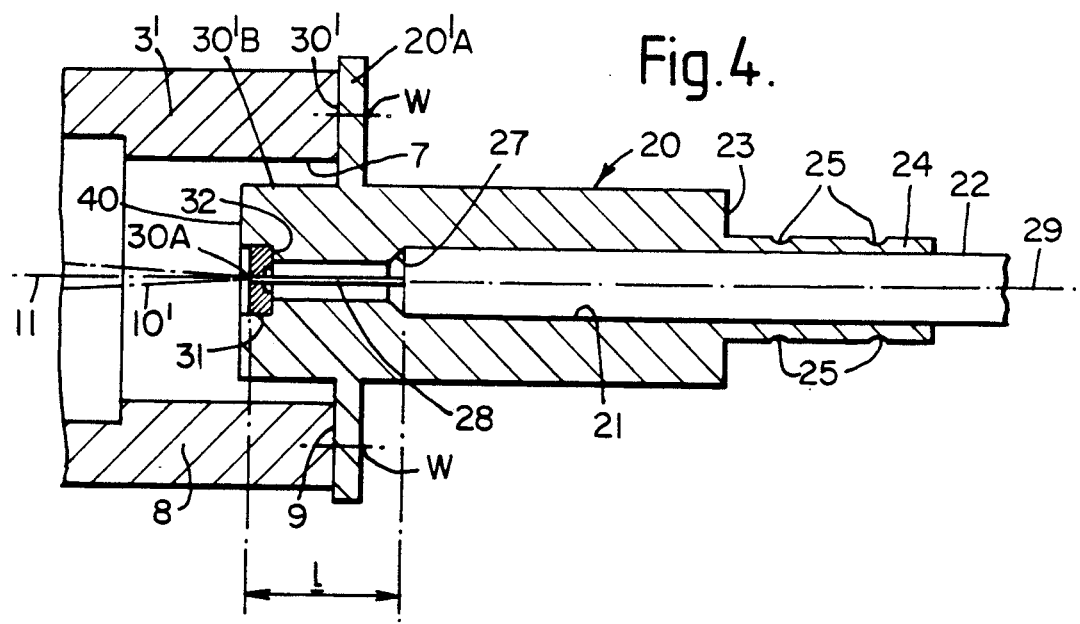
FIG. 4 shows an alternative embodiment of the invention.

An alternative arrangement is shown in FIG. 4 where the fibre termination has the flange 20'A spaced from the end face 40, leaving a boss 30B. The active device, in this case an ELED (edge light emitting diode) has a shorter focal length and so the termination 3' accepts the boss in the bore. Otherwise the arrangement is the same as previously described and the alignment and attachment technique is the same as previously described; like parts have like reference numerals and functionally similar parts have primed corresponding reference numerals, e.g. 30, 30'.

However, the tube has a jewelled ferrule and as illustrated comprises a jewel 31 fitted in a jewel recess having a shoulder 32 and locating the end 30A of the fibre 28. A step 27 in the internal bore 21 acts as a mechanical stop for the fibre when inserted into the tube 20 during manufacture. The jewel replaces the bore 26 in supporting the fibre more precisely.

Figure 5:
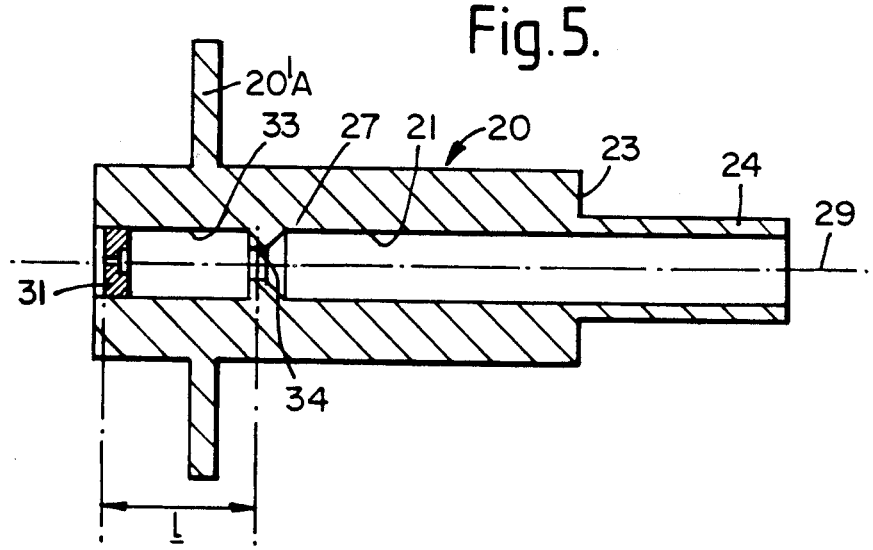
FIG. 5 shows in cross section a part of FIG. 4 in an alternative form.

An alternative to FIG. 4 is shown in FIG. 5 for the fibre termination 20, in that the jewel 32 is press fitted into a bore 33 and there is no shoulder 32 present. Otherwise the FIG. 6 embodiment corresponds in every way to the FIG. 4 embodiment, there being a fibre retaining bore 34 and stop 27, but the fibre 22 is not shown in FIG. 5.

We have found that the tolerance on the z-axis, i.e. the longitudinal dimension in the location of the focal point of the beam 10, 10' at the face 30A of the fibre is of the order of 400 microns, which is well within the manufacturing tolerances of the tube 20 and termination 3. However the x and y axis, i.e. misalignment in a plane normal to the axis 29 is critical and may be typically within 20 microns, although it varies from device to device, being more critical for a laser than an LED, which in turn is more critical than a photodetector. It also depends on the type of line 2 being more critical from a hemispherical lens e.g. five or ten microns than for a spherical lens which would be around twenty microns.

In manufacturing the fibre termination the tube 20 is provided with the jewel 31 as shown in FIG. 4 or FIG. 5, or without the jewel (FIG. 2) and epoxy resin is injected into the bore 21. Thus the prepared fibre is inserted from thhe end 24 which will cause epoxy to exude from the other end. The distance L is arranged to enable the fibre 28 to bend slightly if necessary in the event of slight non-concentricity of fibre in coating and/or bore 26 in retention to bore 21 the aperture in jewel 31 in relation to bore 21.

Before the epoxy has cured the portion 24 is lightly crimped at 25 to hold the portion 24 on the secondary coating of the fibre 22. When the epoxy has hardened the excess length of fibre projecting from the face 30 or 40 is cut and the end 30A lapped and polished.

If desired a lens such as L is secured to the face 30 or 40 or to the jewel 31. A short length of graded index fibre could be used in place of the lens.

To join the tube 20 to the terminator 3 (3') a laser welder is used and an x-y positioning table. First the fibre 22 is connected to an LED source (in the case where the device 1 is a photodetector), and the output power is set so that the power emitting from the end 30A is at a predetermined value.

Then the photodetector 31 and the termination tube 20 are assembled with the flange faces 30 or 30' and 9 or 9' abutting. The tube 20 is clamped to a fixed support and the device 3 clamped to the table.

The output photocurrent of the photodetector 3 is measured on the microammeter while lateral (x and y) movement of the precision x-y tube takes place in a systematic manner until the output of 3 has been optimised, indicating optimum alignment of the optical areas 11 and 29. At this point the laser welder is operated to stake the thin flange by welds W to permanently secure the two parts together in optical alignment. A small coupling loss is expected so that, typically, the photodetector would provide about 0.6 to 0.8 amps of photocurrent per watt of optical power input from the fibre end 30A.

In an alternative monitoring arrangement for e.g. an LED or laser device 1, then the input power to the device would be set at a predetermined value and the output from the fibre 22 monitored to optimise the alignment prior to laser welding.

Figure 7:
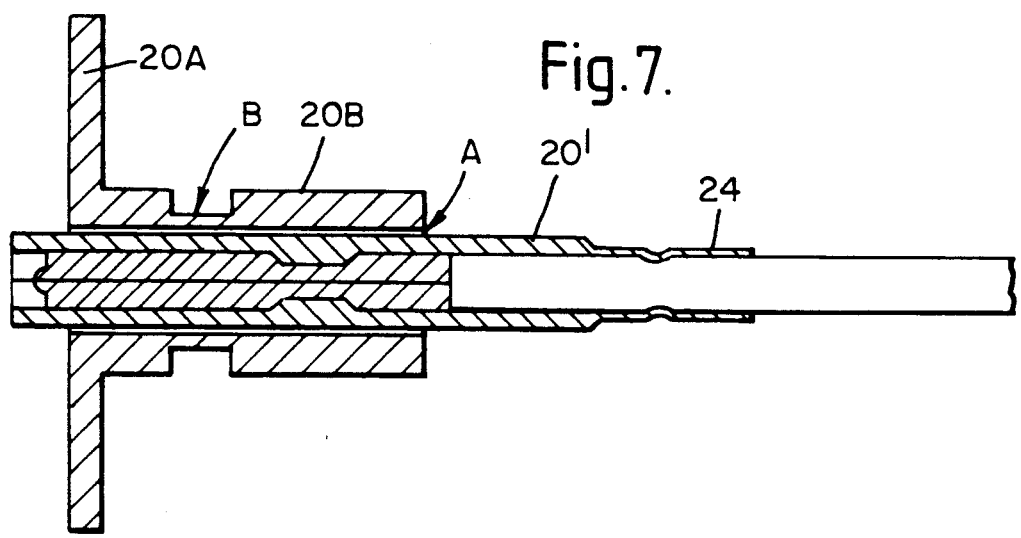
FIG. 7 shows an alternative embodiment with X, Y and Z adjustment possibility.
Figure 8:
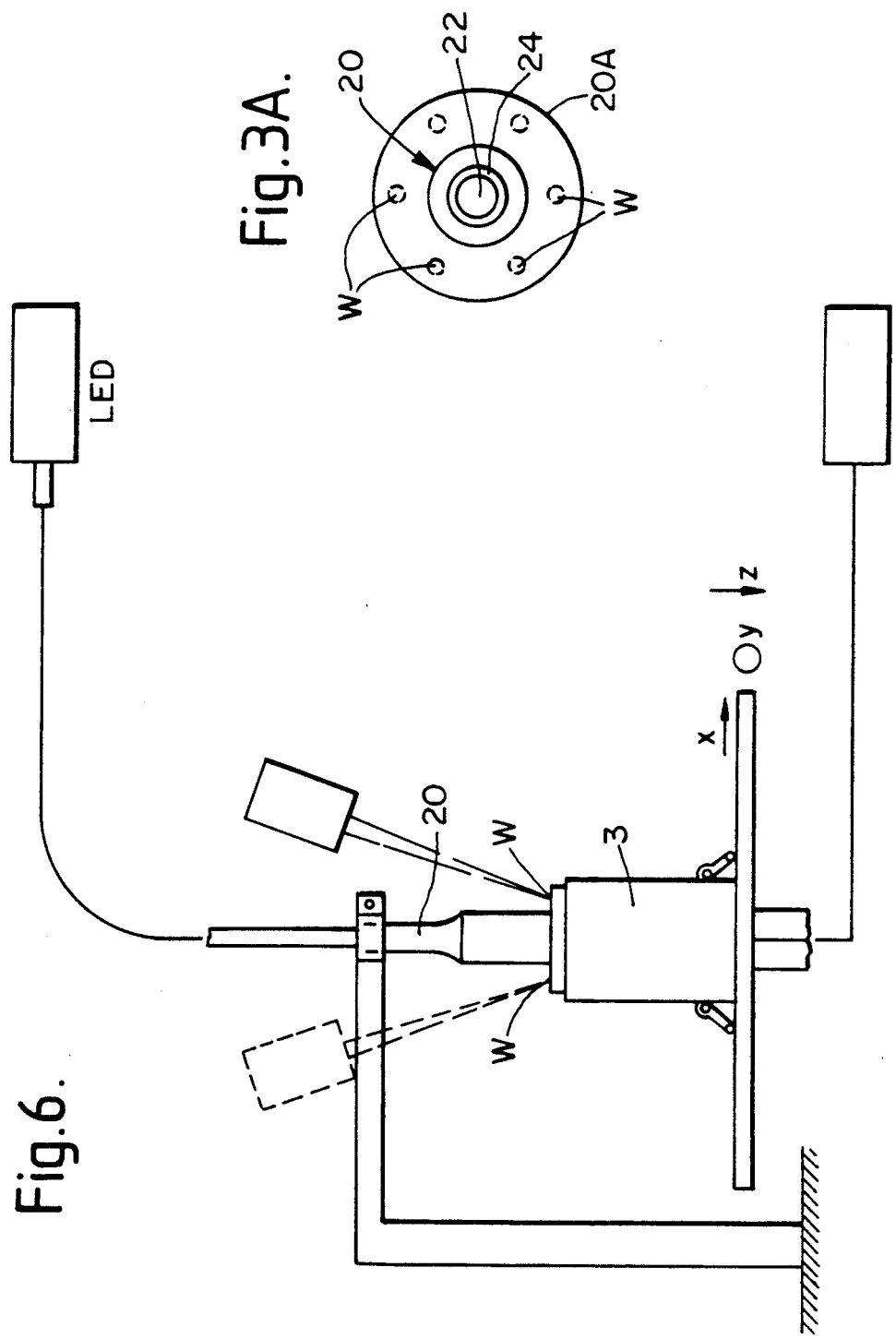
FIG. 8 shows a further embodiment of an emitter package including a spherical lens in the package.

If it should be proven necessary to provide 'Z' axis adjustment, then the arrangement shown in FIG. 7 can be used. In this embodiment the flange 20A is carrier on a parallel tube 20'.

The flange tube 20B slides on a parallel tube 20' with reduced section 24 on the right (to allow crimping to the secondary coating), tube 20' is assembled by jewel or fine bore and epoxy in exactly the same way as previously described. This tube 20' would be a good fit into the flanged termination 20A, 20B and slides easily in the bore 20C of the said termination. We then offer this assembly to the active device (as in e.g. FIG. 4) but we hold both tube 20' and flanged termination 20A during alignment. Alignment consists of x y and z movements. When optimised three (or more) laser welds would be made at point A. This, however, may provide a fulcrum for future movement and consequent alignment loss; to overcome this, further welds are made at point B which is a reduced wall section to permit laser welding. The freezing of the weld pools may cause unacceptable misalignment. We would then realign this assembly to the other part in x and y mode as previously described and weld through the flange exactly as previously described. This variation gives us infinite adjustment of the length of the boss and total control of Z axis dimensions.

Referring now to FIG. 7 there is shown a laser package ready for connection to the fibre tail termination, shown in FIG. 7b.

In FIG. 7a a standard T018 header 40 made of "Covar" (RTM) has four connection pins such as 41 hermetically sealed through the base 40. The base 40 is gold plated.

A unitary block 42 is precision cast from metal and defines a mounting platform 42A for a monitor photodiode 43 and a mounting pedestal 42B for a laser chip 43 in which the emission line is denoted by X. A monitor photodiode 45 is soldered onto the pedestal 42A. Connection such as 46 are made to the pins 41.

The block 42 also defines a fixed mounting surface 42C for a spherical lens 47 of, in this embodiment, 1mm diameter. The surface 42C is a frusto-conical seat and the lens is held in place in the seat by a spring holder 48 which has several radial fingers 48A which urge the lens 47 into its seat.

The axis X of the laser emission is level with the central axis of the lens as viewed in FIG. 7.

A collar 49 holds the spring holder 48 in position against the lens 47 and is soldered in position in the circular recess 42D defined by the mounting block 42. Alternatively the spring holder could have radially-projecting sprags so it can be push-fitted into the circular recess 42D, the sprags biting into the wall 42D, thus eliminating the need for the collar 49.

An hermetic sealing metal cover 50 having a planar glass window 51 is sealed at rim 52 to the header 40.

The hermetic package thus formed is secured into the flanged casing 8 as previously described with reference to e.g. FIG. 1.

The package is assembled as follows. The body 42 is brazed at B to the header 42. The body 42 has a cylindrical surface centred on the axis X and the body is brazed so that the X axis is concentric with the central axis of the header 40, which is also circular.

The lens 47 is inserted in the seat 42C and held in place by the spring holder 48 and collar 49.

Figure 9:
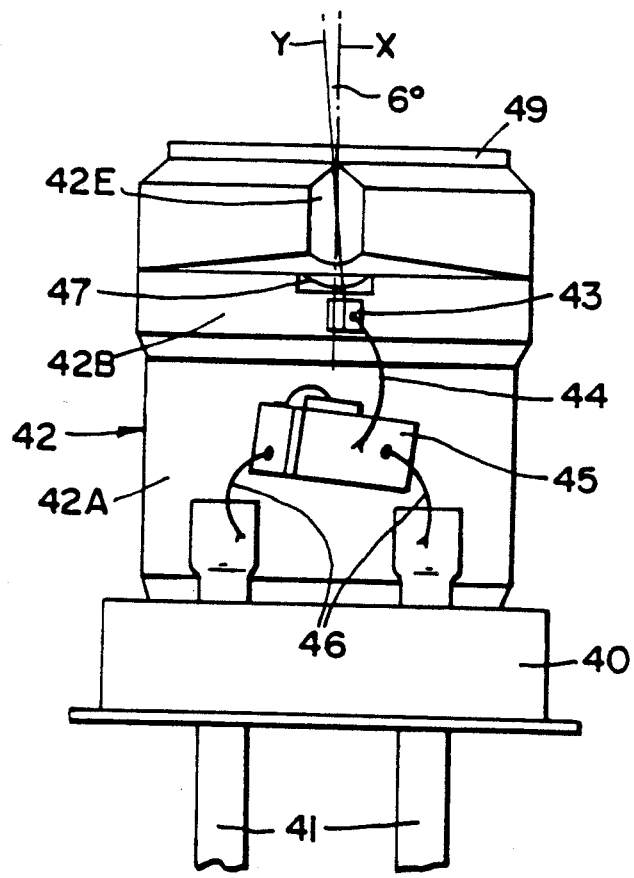
FIG. 9 shows part of FIG. 8 and viewed from the left in FIG. 8.

The laser chip 43 is then soldered to the pedestal 42B either directly or via a heat spreader (not shown) so that the emitted beam is laterally offset from the axis X as viewed in FIG. 9. In this way the lens 47 not only focusses the beam at a point beyond the window 51 and coinciding substantially with the end face of the fibre in the fibre termination, but also deflects the beam so that it emerges from the package at a small angle to the X-axis, approximately 6°, as indicated by the axis Y in FIG. 9.

A marker 42E is used as an angular alignment device to align the package with the fibre subsequently so that the beam Y meets the end face of the fibre at the correct angle.

The monitor photodiode 45 is soldered onto pedestal 42A and connected with the pins 41 and the laser 43.

The assembly is tested and then the cover 50 is hermetically sealed to the header at rim 52.

The hermetic package is then placed in the flanged casing 8 as previously described with reference to e.g. FIG. 1, and held by turning over the rim 5 to hold the package captive.

It should be understood that the header 40 acts to provide a reference datum for the beam axis Y, in terms of the plane of the circle of the flange 52, the axis X being the central axis of the circle and being at 90° to the plane of the flange 52.

The flanged casing 8 is therefore coaxially aligned with the axis X and so the emerging beam axis Y is at the same angle (about 6°) to the normal to the face 9 of flange 8.

Figure 10:
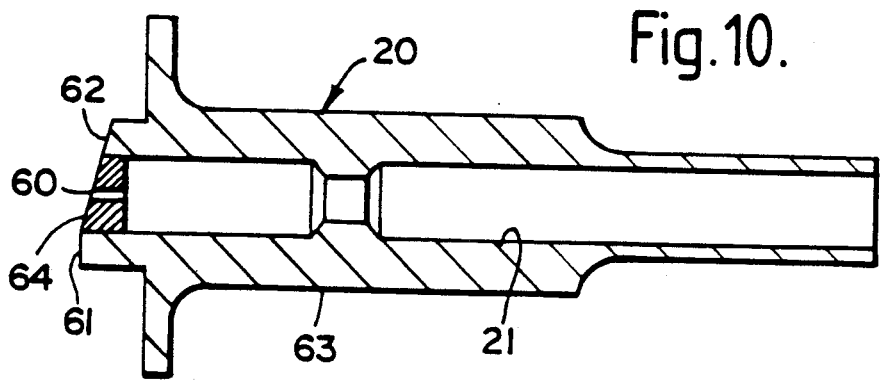
FIG. 10 shows a fibre termination suitable for the package of FIGS. 8 and 9.

Thus in the next step, when the fibre termination of FIG. 10 is offered up to the face 9 in the manner illustrated in FIG. 4 for welding the beam axis Y strikes the end face of the fibre so that the majority of the beam energy is collected by the fibre.

Referring to FIG. 10, the construction is similar to that of FIG. 5, except that the end face 60 of the fibre is angled along with the end face 62 of the supporting tube 20 and the jewel mount 64. The fibre is not shown in FIG. 10. The tube has an internal bore 21 and all other parts are similar to those depicted in and described with reference to FIG. 5, and so similar parts described with reference to FIG. 5, and so similar parts have like reference numerals. In addition a marker 65 on the flange 20A is used to provide angular orientation of the inclined face 62 with the angled beam Y of the package so that the majority of the beam energy is substantially wholly captured by the fibre 22.

Figure 10A:
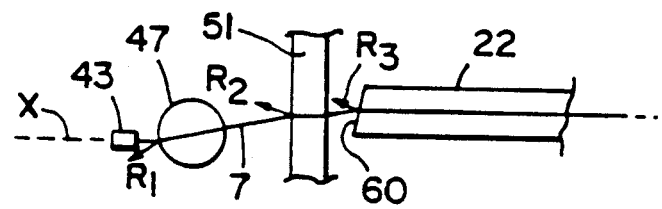
FIG. 10A shows diagramatically the light path through the embodiment of FIGS. 8 to 10.

This arrangement not only prevents reflections from the window 51 getting back to the laser, but also reflections from the inclined fibre end face 60, and from the lens 47. This is shown in FIG. 10A diagrammatically, where reflections from the lens 47 are indicated $R_1$, from the window $R_2$ and from the fibre end face $R_3$. The angle between the fibre end face 60 and the normal to the fibre axis is about 15°. The angular orientation of the fibre in relation to the laser package is tolerant within ±5°.

We claim:

1. An optical electronic package comprising an optical receiver or emitter device having an optical fibre tail end optically coupled thereto via an optical sealed window, the package comprising a lens focussing optical energy passing between said device and said tail end, an hermetic container encasing the device and having said optical window therein, a fibre termination body rigidly holding the fibre tail therein, said body having a thin flange at said tail end extending radially from the optical axis of the device said container having a wall abutting the flange, said container and said body being permanently held together by a plurality of spot welds through said flange onto said wall so that the focussed optical energy is optimally coupled between said device and said tail end.

2. A package as claimed inn claim 1, wherein the fibre has a secondary coating and an end portion from which the coating has been removed and forming said tail end, said end portion being located in a first small bore of the terminating body at an end face of the body, said secondary coating being located in a larger bore of the body.

3. A package as claimed din claim 2, wherein the first small bore of the terminating body is defined by a jewelled bearing.

4. A package as claimed inn claim 2, wherein the termination body has the flange and the flange is located at the end of the body.

5. A package as claimed in claim 2, wherein the termination body has the flange, and the flange has a central boss projecting into the container.

6. A package as claimed in claim 1 wherein the termination body has the flange and the flange is located at an end of the body.

7. A package as claimed in claim 1, wherein the termination body has the flange, and the flange has a central boss projecting into the container.

8. A package as claimed in claim 1, wherein the terminating body has a thin-walled tubular portion which is lightly crimped onto the tail fibre.

9. A package as claimed in claim 1, wherein the fibre tail is bonded with epoxy into the terminating body.

10. A package as claimed in claim 1, wherein the termination body comprises a first tube carrying the flange and a second tube secured to the fibre tail end, the first and second tubes being fitted together one inside the other.

11. A method of optically coupling an optical semiconductor receiver or emitter device with an optical fibre tail end via an optical window to provide an optical electronic package, said package including a lens focussing optical energy transferred between said tail end and said device, comprising providing said device in an hermetic container having said window and a wall around the optical axis of the window, providing a fibre with a tail end fixed in a termination body, said body having a thin flange wall around the optical axis of the fibre tail end, abutting the wall together while monitoring the focussed optical energy transferred between the fibre and the device, adjusting the relative lateral position of said body and said container to optimise said optical energy being monitored, and securing the flange wall to the other wall by forming spot welds through said flange wall onto said other wall at a plurality of spaced apart locations.

12. A method as claimed inn claim 11 wherein the flange is movable longitudinally of the fibre, and wherein the flange and the fibre are longitudinally moved to optimise the spacing between the fibre tail end and the window, and then fixing the relative position of the fibre with respect to the flange.

13. A method as claimed in claim 11, comprising providing a hollow casing, assembling and fixing the container in the casing so that said casing defines said wall around the optical axis through the window, and then welding the flange wall to the other wall.

14. An optical electronics package comprising an optical transmitter having an optically coupled thereto via a window, said package comprising a lens focussing the optical energy from said emitter onto said fibre tail, an hermetic structure encasing the transmitter and having said window sealed in the structure so that optical energy from the transmitter exits via said window, said fibre tail having an end fixed in a termination sleeve with a thin flange wall extending radially of the fibre end axis, said thin flange wall being secured to said structure with a plurality of spot welds.

15. A package as claimed inn claim 14, wherein the optical energy exits from the window at an angle to the axis of the fibre, and wherein said fibre has an end face which is inclined to the fibre axis.

16. A method of making an optical transmitter package comprising providing a mounting body having a fixed lens seat and a pedestal for a transmitter device, securing a spherical lens in the seat, and securing the transmitter device to the pedestal in such a position that optical energy from the device will emerge from the package at an angle to the normal through a plane containing a securing surface, said package being hermetically sealed and securable to an optical fibre termination by said surface, said optical fibre having an inclined face to receive said optical energy.

* * * * *